(12) United States Patent
Natali et al.

(10) Patent No.: US 10,373,752 B2
(45) Date of Patent: Aug. 6, 2019

(54) MAGNETIC MATERIALS AND DEVICES COMPRISING RARE EARTH NITRIDES

(71) Applicants: Franck Natali, Wellington (NZ); Benjamin John Ruck, Lower Hutt (NZ); Harry Joseph Trodahl, Upper Moutere (NZ); Eva-maria Johanna Anton, Wellington (NZ); James Francis McNulty, Wellington (NZ); Simon Edward Granville, Wellington (NZ)

(72) Inventors: Franck Natali, Wellington (NZ); Benjamin John Ruck, Lower Hutt (NZ); Harry Joseph Trodahl, Upper Moutere (NZ); Eva-maria Johanna Anton, Wellington (NZ); James Francis McNulty, Wellington (NZ); Simon Edward Granville, Wellington (NZ)

( * ) Notice: Subject to any disclaimer, the term of this patent is extended or adjusted under 35 U.S.C. 154(b) by 106 days.

(21) Appl. No.: 15/300,753

(22) PCT Filed: Mar. 31, 2015

(86) PCT No.: PCT/NZ2015/050038
§ 371 (c)(1),
(2) Date: Sep. 29, 2016

(87) PCT Pub. No.: WO2015/152736
PCT Pub. Date: Oct. 8, 2015

(65) Prior Publication Data
US 2017/0018346 A1    Jan. 19, 2017

(30) Foreign Application Priority Data
Apr. 2, 2014  (NZ) ........................ 623343

(51) Int. Cl.
*H01F 10/12*  (2006.01)
*H01F 41/30*  (2006.01)
(Continued)

(52) U.S. Cl.
CPC ......... *H01F 10/126* (2013.01); *H01F 41/302* (2013.01); *H01L 43/08* (2013.01);
(Continued)

(58) Field of Classification Search
CPC .... H01F 10/126; H01F 10/18; H01F 10/3254; H01F 41/302; H01L 43/08; H01L 43/10; H01L 43/12
See application file for complete search history.

(56) References Cited

U.S. PATENT DOCUMENTS

| 5,611,955 A | 3/1997 | Barrett et al. |
| 6,544,867 B1 | 4/2003 | Webb et al. |

(Continued)

FOREIGN PATENT DOCUMENTS

| JP | 2006-080379 A | 3/2006 |
| JP | 2008-112845 A | 5/2008 |

(Continued)

OTHER PUBLICATIONS

Blamire, G., M., et al., "Spin filter superconducting tunnel junctions," Proceedings of SPIE, vol. 8461, pp. 84610J-1-84610J-6 (Sep. 27, 2012).
(Continued)

*Primary Examiner* — Veronica F Faison
(74) *Attorney, Agent, or Firm* — Maschoff Brennan (57) ABSTRACT

Disclosed herein are magnetic materials comprising rare earth nitrides and, more particularly, magnetic materials comprising multilayer-structured materials comprising one relatively soft and one relatively hard magnetic layer. The magnetic materials comprise a first ferromagnetic layer, a (Continued)

1 (Magnetic material)

| 25 (Capping layer; optional) |
|---|
| 10 (Second ferromagnetic layer) |
| 15 (Blocking layer) |
| 5 (First ferromagnetic layer) |
| 20 (Substrate; optional) | second ferromagnetic layer, and a blocking layer between and in contact with each of the first and second ferromagnetic layers. The first and second ferromagnetic layers have different coercive fields. The first ferromagnetic layer comprises a first rare earth nitride material and the second ferromagnetic layer comprises a second rare earth nitride material. Also disclosed are methods for preparing the materials. The materials are useful in the fabrication of devices, such as GMR magnetic field sensors, MRAM devices, TMR magnetic field sensors, and magnetic tunnel junctions.

20 Claims, 5 Drawing Sheets (51) Int. Cl.
H01L 43/08 (2006.01)
H01L 43/10 (2006.01)
H01L 43/12 (2006.01)
H01F 10/32 (2006.01)
H01L 21/02 (2006.01)

(52) U.S. Cl.
CPC .............. *H01L 43/10* (2013.01); *H01L 43/12* (2013.01); *H01F 10/3254* (2013.01); *H01L 21/02439* (2013.01); *H01L 21/02502* (2013.01); *H01L 21/02521* (2013.01)

(56) References Cited

U.S. PATENT DOCUMENTS

| | | | |
|---|---|---|---|
| 6,791,866 | B2 | 9/2004 | Ikeda |
| 7,037,806 | B1 | 5/2006 | Atanackovic |
| 7,038,942 | B2 | 5/2006 | Ohmori |
| 7,129,555 | B2 | 10/2006 | Nozieres et al. |
| 7,170,095 | B2 | 1/2007 | Vaudo et al. |
| 7,253,080 | B1 | 8/2007 | Atanackovic |
| 7,271,981 | B2 | 9/2007 | Ju et al. |
| 7,313,013 | B2 | 12/2007 | Sun et al. |
| 7,332,781 | B2 | 2/2008 | Nozieres et al. |
| 7,459,769 | B2 | 12/2008 | Kato et al. |
| 7,466,585 | B2 | 12/2008 | Wu et al. |
| 7,471,543 | B2 | 12/2008 | Nakashima et al. |
| 7,473,612 | B2 | 1/2009 | Kanno et al. |
| 7,489,541 | B2 | 2/2009 | Pakala et al. |
| 7,518,216 | B2 | 4/2009 | Koukitu et al. |
| 7,560,724 | B2 | 7/2009 | Aratani et al. |
| 7,580,276 | B2 | 8/2009 | Sawa et al. |
| 7,684,147 | B2 | 3/2010 | Ahn et al. |
| 7,719,082 | B2 | 5/2010 | Aratani et al. |
| 7,755,136 | B2 | 7/2010 | Nishikawa et al. |
| 7,816,737 | B2 | 10/2010 | Clark |
| 7,932,505 | B2 | 4/2011 | Sawa et al. |
| 8,012,442 | B2 | 9/2011 | Clark |
| 8,088,466 | B2 | 1/2012 | Nee |
| 8,102,701 | B2 | 1/2012 | Prejbeanu et al. |
| 8,295,074 | B2 | 10/2012 | Yasuda et al. |
| 8,331,139 | B2 | 12/2012 | Gallagher et al. |
| 9,309,162 | B2 | 4/2016 | Azimi et al. |
| 2005/0122828 | A1 | 6/2005 | Odagawa et al. |
| 2005/0161663 | A1* | 7/2005 | Atanackovic .......... B82Y 20/00 257/19 |
| 2005/0166834 | A1* | 8/2005 | Atanackovic .......... B82Y 20/00 117/84 |
| 2007/0235821 | A1 | 10/2007 | Clark |
| 2010/0109018 | A1 | 5/2010 | Chen et al. |
| 2012/0098024 | A1 | 4/2012 | Hsu et al. |
| 2012/0230089 | A1 | 9/2012 | Yamada et al. |
| 2013/0248853 | A1 | 9/2013 | Arkun et al. |
| 2013/0251946 | A1 | 9/2013 | Azimi et al. |
| 2014/0312523 | A1* | 10/2014 | Kawashita ............... C22C 38/00 264/134 |
| 2014/0349099 | A1* | 11/2014 | Kawashita ............ C22C 38/002 428/220 |

FOREIGN PATENT DOCUMENTS

| | | |
|---|---|---|
| JP | 2008112845 A | 5/2008 |
| JP | 2008-274342 A2 | 11/2008 |
| JP | 2015002297 A | 1/2015 |
| TW | 200603101 A | 1/2006 |

OTHER PUBLICATIONS

CN Office Action dated Jul. 4, 2018 as received in Application No. 201580027695.5.
Kent, F., T., et al., "Epitaxial ferromagnetic nanoislands of cubic GdN in hexagonal GaN," Applied Physics Letters, vol. 100, Issue 15, pp. 152111-152111 (Apr. 9, 2012).
Krishnamoorthy, S., et al., "GdN Nanoisland-Based GaN Tunnel Junctions," Nano Letters, vol. 13, Issue 6, pp. 2570-2575 (2013).
Lee, M., C., et al., "Highly resistive epitaxial Mg-doped GdN thin films," Applied Physics Letters, vol. 106, pp. 022401-1-022401-3 (2015) https://doi.org/10.1063/1.4905598.
Natali, F., et al., "Epitaxial growth and properties of GdN, EuN and SmN thin films", Physics Status Solidi, vol. 9, Issue 3-4, pp. 605-608 (Dec. 7, 2011).
Natali, F., et al., "Rare-earth mononitrides," The MacDiarmid Institute for Advanced Materials and Nanotechnology, School of Chemical and Physical Sciences, pp. 36 (2013).
Supplementary European Search Report dated Nov. 24, 2017 as received in Application No. 15772637.
International Search Report (ISR) from parent application PCT/NZ2015/050038, dated Nov. 30, 2015.
Written Opinion (WO)from parent application PCT/NZ2015/050038, dated Nov. 30, 2015.
JP Office Action in application No. 2016-560768 dated Jan. 22, 2019.

\* cited by examiner 1 (Magnetic material)

| |
|---|
| 25 (Capping layer; optional) |
| 10 (Second ferromagnetic layer) |
| 15 (Blocking layer) |
| 5 (First ferromagnetic layer) |
| 20 (Substrate; optional) |

MAGNETIC MATERIALS AND DEVICES COMPRISING RARE EARTH NITRIDES

TECHNICAL FIELD

The present invention relates to magnetic materials comprising rare earth nitrides and, more particularly, magnetic materials comprising multilayer-structured materials comprising one relatively soft and one relatively hard magnetic layer. The present invention further relates to devices comprising the magnetic materials.

BACKGROUND

The rare earths have atomic numbers from 57 (La) to 71 (Lu), and comprise the elements across which the 4f orbitals are filled: that is, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). They have atomic configurations $[Xe]6s^2 5d^1 4f^n$ or $[Xe]6s^2 4f^{n+1}$, with n varying from 0 for La to 14 for Lu. Their most common ionic charge state is 3+, with the 4f levels spanning the Fermi energy. They are the only stable elements with more than marginally filled f-shell electronic orbitals and, as a consequence, they are the elements with the largest spin and orbital moments. In ordered solids they contribute to the most strongly ferromagnetic materials, a contribution that has ensured their utility in technologies that require strong permanent magnets. Despite their name they are by no means rare, with the exception of promethium, which has no stable nuclear isotope.

The rare earth nitrides were first investigated in the 1960s, when technological developments overcame the problems faced in separating the chemically similar members of the rare earth series. The rare earth nitrides are almost all ferromagnetic with magnetic states that vary strongly across the series and coercive fields depending strongly on the growth conditions. For example, SmN is the only known near-zero-moment ferromagnetic semiconductor, with an enormous coercive field, and GdN has a coercive field some three orders of magnitude smaller. The rare earth nitrides show promise in applications as diverse as spintronics, infrared (IR) detectors, and as contacts to group III nitride semiconductor compounds.

Magnetoresistive random-access memory (MRAM) is a non-volatile random-access memory technology. Data in MRAM is stored by magnetic storage elements, while other RAM technologies typically store data as electric charge or current flows. The magnetic storage elements in MRAM are formed from two magnetic layers, each of which can hold a magnetic field, separated by a barrier layer. One magnetic layer is a permanent magnet set to a particular magnetic alignment. The other magnetic layer stores data by aligning to an external field. The element can then exist in different configurations, with either parallel or antiparallel magnetisation directions. The two magnetic configurations are then distinguished because the electrical resistance through an element with an insulating barrier layer, or the resistance along a metallic barrier layer, is smaller when the magnetic layers are aligned parallel.

The structure and operational principles of giant magnetoresistance (GMR) and tunneling magnetoresistance (TMR) magnetic field sensors are similar.

All of the existing devices, however, have metallic magnetic layers.

Accordingly, it is an object of the present invention to go some way to avoiding the above disadvantage; and/or to at least provide the public with a useful choice.

Other objects of the invention may become apparent from the following description which is given by way of example only.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date.

SUMMARY OF THE INVENTION

In a first aspect, the present invention provides a magnetic material comprising a first ferromagnetic layer, a second ferromagnetic layer, and a blocking layer between and in contact with each of the first and second ferromagnetic layers, wherein the first and second ferromagnetic layers have different coercive fields, and wherein the first ferromagnetic layer comprises a first rare earth nitride material and the second ferromagnetic layer comprises a second rare earth nitride material, and wherein the first and second rare earth nitride materials are each independently selected from the group consisting of praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), and ytterbium nitride (YbN), and alloys of any two or more thereof.

In a second aspect, the present invention provides a magnetic device comprising a magnetic material of the first aspect and, optionally, electrical contacts.

In a third aspect, the present invention provides a method of preparing a magnetic material of the first aspect, the method comprising the steps of:

(a) depositing a first ferromagnetic layer comprising a first rare earth nitride material;
(b) depositing a blocking layer on the first ferromagnetic layer formed in step (a); and
(c) depositing a second ferromagnetic layer comprising a second rare earth nitride material on the blocking layer formed in step (b).

In a fourth aspect, the present invention provides a magnetic material when prepared by a method of the third aspect.

The present invention also provides a magnetic material obtainable by a method of the third aspect.

This invention may also be said broadly to consist in the parts, elements and features referred to or indicated in the specification of the application, individually or collectively, and any or all combinations of any two or more said parts, elements or features, and where specific integers are mentioned herein which have known equivalents in the art to which this invention relates, such known equivalents are deemed to be incorporated herein as if individually set forth.

In addition, where features or aspects of the invention are described in terms of Markush groups, those persons skilled in the art will appreciate that the invention is also thereby described in terms of any individual member or subgroup of members of the Markush group.

As used herein "(s)" following a noun means the plural and/or singular forms of the noun.

As used herein the term "and/or" means "and" or "or" or both.

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

Although the present invention is broadly as defined above, those persons skilled in the art will appreciate that the invention is not limited thereto and that the invention also includes embodiments of which the following description gives examples.

BRIEF DESCRIPTION OF THE DRAWINGS

The invention will now be described with reference to the Figure in which.

DETAILED DESCRIPTION OF THE INVENTION

In a first aspect, the present invention provides a magnetic material comprising a first ferromagnetic layer, a second ferromagnetic layer, and a blocking layer between and in contact with each of the first and second ferromagnetic layers, wherein the first and second ferromagnetic layers have different coercive fields, and wherein the first ferromagnetic layer comprises a first rare earth nitride material and the second ferromagnetic layer comprises a second rare earth nitride material, and wherein the first and second rare earth nitride materials are each independently selected from the group consisting of praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), and ytterbium nitride (YbN), and alloys of any two or more thereof.

In some embodiments, the first and second rare earth nitride materials are each independently selected from the group consisting of PrN, NdN, SmN, EuN, GdN, TbN, DyN, HoN, ErN, TmN, and YbN.

In some embodiments, the first and second rare earth nitride materials are each independently selected from the group consisting of PrN, NdN, SmN, GdN, TbN, DyN, HoN, ErN, and TmN, and alloys of any two or more thereof.

In some embodiments, the first and second rare earth nitride materials are each independently selected from the group consisting of PrN, NdN, SmN, GdN, TbN, DyN, HoN, ErN, and TmN.

In some embodiments, the first and second rare earth nitride materials are each independently selected from the group consisting of NdN, SmN, EuN, GdN, DyN, HoN, ErN, and YbN, and alloys of any two or more thereof.

In some embodiments, the first and second rare earth nitride materials are each independently selected from the group consisting of NdN, SmN, EuN, GdN, DyN, HoN, ErN, and YbN.

In some embodiments, the first and second rare earth nitride materials are each independently selected from the group consisting of NdN, SmN, GdN, DyN, HoN, and ErN, and alloys of any two or more thereof.

In some embodiments, the first and second rare earth nitride materials are each independently selected from the group consisting of NdN, SmN, GdN, DyN, HoN, and ErN.

In some embodiments, one or both of the first and second rare earth nitride materials is a rare earth nitride alloy. In some embodiments, the rare earth nitride alloy is selected from the group consisting of (Sm,Gd)N, (Gd,Ho)N, and (Gd,Dy)N. In some embodiments, the rare earth nitride alloy is (Sm,Gd)N. In some embodiments, the rare earth nitride alloy is (Gd,Ho)N. In some embodiments, the rare earth nitride alloy is (Gd,Dy)N.

In some embodiments, one or both of the first and second rare earth nitride materials further comprises one or more additional dopant(s). Generally, the first and second rare earth nitride materials comprise less than about $10^{21}$ atoms/$cm^3$ of additional dopant(s) or other impurities. In some embodiments, the first and second rare earth nitride materials comprise less than about $10^{20}$ atoms/$cm^3$ of additional dopant(s) or other impurities. In some embodiments, the first and second rare earth nitride materials comprise less than about $10^{19}$ atoms/$cm^3$ of additional dopant(s) or other impurities.

In some embodiments, the first ferromagnetic layer consists of a first rare earth nitride material. In other embodiments, the first ferromagnetic layer consists essentially of a first rare earth nitride material.

In some embodiments, the second ferromagnetic layer consists of a second rare earth nitride material. In other embodiments, the second ferromagnetic layer consists essentially of a second rare earth nitride material.

In some embodiments, the composition of the first ferromagnetic layer and the second ferromagnetic layer are different. In some embodiments, the composition of the first ferromagnetic layer and the second ferromagnetic layer are the same.

In some embodiments, the first rare earth nitride material and the second rare earth nitride material are different. In some embodiments, the first rare earth nitride material and the second rare earth nitride material are the same.

The first and second ferromagnetic layers have different coercive fields, that is the coercive field of one of the ferromagnetic layers is higher than the coercive field of the other ferromagnetic layer. This, together with the blocking layer discussed below, permits the magnetic alignment of the ferromagnetic layer with the lower coercive field to be altered by an external field or by spin transfer torque without altering the magnetic alignment of the ferromagnetic layer with the higher coercive field.

In some embodiments, the coercive field of the first ferromagnetic layer is higher than that of the second ferromagnetic layer. In other embodiments, the coercive field of the second ferromagnetic layer is higher than that of the first ferromagnetic layer.

The coercive field of the ferromagnetic layer with the lower coercive field is typically less than about 500 Oe. In some embodiments, the coercive field of the ferromagnetic layer with the lower coercive field is less than about 200 Oe.

The coercive field of the ferromagnetic layer with the higher coercive field is typically larger than the coercive field of the layer with the lower coercive field by a factor of at least about 2. In some embodiments, the coercive field of the ferromagnetic layer with the higher coercive field is larger than the coercive field of the layer with the lower coercive field by a factor of at least about 10. In some embodiments, the coercive field of the ferromagnetic layer with the higher coercive field is larger than the coercive field of the layer with the lower coercive field by a factor of at least about 100.

In some embodiments, the coercive fields are measured at about 70 K. In other embodiments, the coercive fields are measured at about 50 K. In other embodiments, the coercive fields are measured at about 4 K.

In some embodiments, the coercive field difference between the first and second ferromagnetic layers is temperature sensitive. Such temperature sensitivity may enable the magnetic material to be tuned for use in different applications.

Advantageously, several RENs are very highly spin-polarised, in contrast to ordinary ferromagnetic metals typically used in magnetic sensors or for MRAM structures (for example, CoFe and NiFe), which have ~60% or lower spin polarisation ratios.

Spintronics devices, for example, operate based on the interplay between magnetism and electrical conduction, which is much stronger if all of the conduction electrons (or holes) are spin polarised. The magnetic materials of the invention are expected to show stronger contrast (compared to materials comprising more weakly spin-polarised materials) between, for example, the resistance when the magnetisation of the second ferromagnetic layer is opposite to the magnetisation of the first ferromagnetic layer, and the resistance when the magnetisation of both layers is aligned.

Advantageously, rare earth nitrides have a conduction band that is very strongly based on rare earth d-electrons, in contrast to ordinary ferromagnetic metals which have weakly polarised s-electrons at the Fermi level. The s-electrons dominate tunneling, which is a disadvantage in some devices.

In some embodiments, the first ferromagnetic rare earth nitride material comprises GdN.

In some embodiments, the second ferromagnetic rare earth nitride material comprises SmN. Advantageously, SmN, even though ferromagnetically ordered, has an almost vanishingly small magnetic fringe field, which prevents realignment of an adjacent softer magnetic layer when an external applied magnetic field is switched off.

In some embodiments, both the first ferromagnetic rare earth nitride material and the second ferromagnetic rare earth nitride material comprise GdN.

In some embodiments, the first ferromagnetic rare earth nitride material comprises GdN and the second ferromagnetic rare earth nitride material comprises SmN. In some embodiments, the first ferromagnetic rare earth nitride material comprises SmN and the second ferromagnetic rare earth nitride material comprises GdN.

The coercive field difference for GdN and SmN is about three orders of magnitude.

The blocking layer is a nonmagnetic material, that is the blocking layer has no permanent magnetic moment or has no ordering of the intrinsic electron spins. The blocking layer permits independent control of the magnetic alignment of the first and second ferromagnetic layers by an external field or spin transfer torque, that is the blocking layer prevents magnetic exchange between the first and second ferromagnetic layers.

Suitable blocking layers are non-reactive with the first and second ferromagnetic layers and are stable during the processing conditions used for preparing the magnetic material.

In some embodiments, the blocking layer is selected from the group consisting of LaN, LuN, HfN, AlN, GaN, and (Al,In,Ga)N alloys.

In some embodiments, the blocking layer is selected from the group consisting of LaN, LuN, and GaN.

In some embodiments, the blocking layer comprises GaN. In some embodiments, the blocking layer consists of GaN. In other embodiments, the blocking layer consists essentially of GaN.

In some embodiments, the blocking layer is a conductor. In other embodiments, the blocking layer is a semiconductor. In other embodiments, the blocking layer is an insulator.

In those embodiments wherein the blocking layer is a conductor, the magnetic material is suitable for use in GMR magnetic field sensors, while magnetic materials comprising insulating blocking layers are suitable for use in MRAM devices and TMR magnetic field sensors, and magnetic materials comprising semiconducting blocking layers are suitable for use in magnetic tunnel junctions.

In some embodiments, the blocking layer is epitaxial with the first ferromagnetic layer. In other embodiments, the blocking layer is polycrystalline.

In some embodiments, the second ferromagnetic layer is epitaxial with the blocking layer. In other embodiments, the second ferromagnetic layer is polycrystalline.

In some embodiments, the blocking layer is epitaxial with the first ferromagnetic layer and the second ferromagnetic layer is epitaxial with the blocking layer.

The rare earth nitrides form in the face-centered cubic NaCl structure with lattice constants ranging from ~5.3 Å for LaN to ~4.76 Å for LuN, in total a 10% difference across the series and about 0.7% between nitrides of neighbouring atomic species. The rare earth nitrides are, therefore, epitaxy compatible.

Accordingly, in some embodiments, the blocking layer comprises a third rare earth nitride material.

In some embodiments, the blocking layer comprises LaN or LuN.

In some embodiments, the blocking layer consists of LaN. In other embodiments, the blocking layer consists essentially of LaN.

In some embodiments, the blocking layer consists of LuN. In other embodiments, the blocking layer consists essentially of LuN.

Suitable blocking layers also include multilayer-structured materials.

In some embodiments, the first and second ferromagnetic layers are each independently about 5-200 nm thick. In some embodiments, the first ferromagnetic layer and the second ferromagnetic layer are substantially the same thickness. In other embodiments, the first ferromagnetic layer and the second ferromagnetic layer have different thicknesses.

The blocking layer is typically about 1-200 nm thick. In some embodiments, particularly those in which the blocking layer is an insulator, the blocking layer is about 1-10 nm thick. In some embodiments, particularly those in which the blocking layer is a conductor, the blocking layer is about 5-200 nm thick.

In some embodiments, the magnetic material further comprises a substrate in contact with the first ferromagnetic layer.

Suitable substrates are non-reactive with the first ferromagnetic layer and are stable during the processing conditions used for preparing the magnetic material.

In some embodiments, the substrate is a conductor. In other embodiments, the substrate is a semiconductor. In other embodiments, the substrate is an insulator.

In some embodiments, the first ferromagnetic layer is epitaxial with the substrate. In other embodiments, the first ferromagnetic layer is polycrystalline.

In some embodiments, the first ferromagnetic layer is epitaxial with the substrate and the blocking layer is epitaxial with the first ferromagnetic layer.

In some embodiments, the first ferromagnetic layer is epitaxial with the substrate, the blocking layer is epitaxial with the first ferromagnetic layer, and the second ferromagnetic layer is epitaxial with the blocking layer.

In some embodiments, the substrate is AlN, GaN or an (Al,In,Ga)N alloy.

Other suitable substrates include, but are not limited to, yttria-stabilized zirconia (YSZ) and MgO.

Further suitable substrates include, but are not limited to Al, W, Cr, Cu, Gd, Mg, TaN, NbN, GaAs, and $MgF_2$.

Suitable substrates include multilayer-structured materials. For example, multilayer-structured substrates may comprise a buffer layer in contact with the first ferromagnetic layer.

In some embodiments, the substrate comprises Si or $Al_2O_3$, optionally with a buffer layer of AlN or GaN. In other embodiments, the buffer layer is an (Al,In,Ga)N alloy.

In some embodiments, the substrate comprises $Al_2O_3$. In some embodiments, the substrate comprises $Al_2O_3$ oriented along the (111) plane. In some embodiments, the substrate comprises $Al_2O_3$ oriented along the (111) plane with an epitaxial (hexagonal axis) buffer layer of AlN or GaN.

In some embodiments, the magnetic material further comprises a capping layer in contact with the second ferromagnetic layer.

Due to their decomposition in air, thin films of rare earth nitrides on a substrate are generally passivated with an effective capping layer to avoid reaction with the ambient atmosphere.

Suitable capping layers are non-reactive with the second ferromagnetic layer.

The capping layer may be epitaxial with the second ferromagnetic layer, polycrystalline, or amorphous.

Suitable materials for the capping layer include, but are not limited to Al, W, Cr, Cu, Gd, Mg, TaN, NbN, Si, YSZ, GaN, GaAs, AlN, (Al,In,Ga)N alloys, and $MgF_2$.

In some embodiments, the capping layer is selected from AlN, GaN, (Al,In,Ga)N alloys, and Si.

In some embodiments, the capping layer is selected from AlN and GaN. Advantageously, AlN and GaN are transparent, allowing optical measurements. Other advantages of AlN and GaN include their ease of growth and good chemical stability over time.

In some embodiments, the capping layer is GaN.

Figure 1:
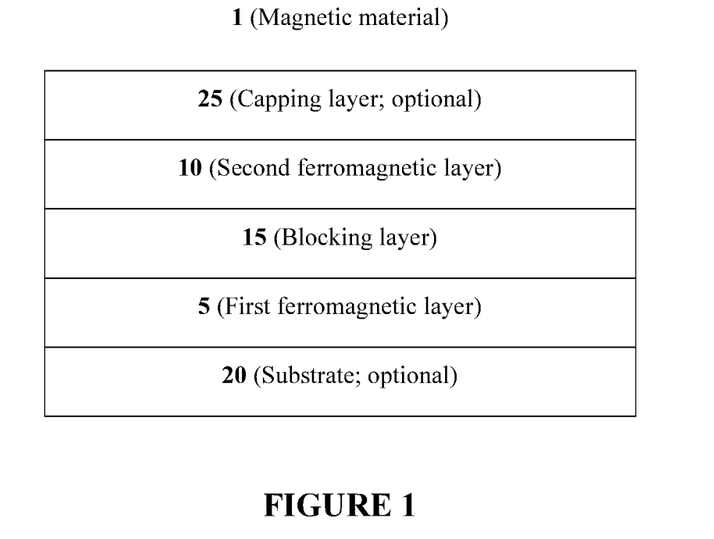
FIG. 1 is a cross-section of a magnetic material according to one embodiment of the invention.

One embodiment of a magnetic material of the invention is shown in FIG. 1.

Referring to FIG. 1, the magnetic material (1) comprises a first ferromagnetic layer (5), a second ferromagnetic layer (10) and a blocking layer (15) between and in contact with each of the first (5) and second (10) ferromagnetic layers. The first ferromagnetic layer (5) comprises a first rare earth nitride material and the second ferromagnetic layer (10) comprises a second rare earth nitride material. The first (5) and second (10) rare earth nitride materials have different coercive fields. The embodiment of the magnetic material (1) shown in FIG. 1 further comprises an optional substrate (20) in contact with the first ferromagnetic layer (5) and an optional capping layer (25) in contact with the second ferromagnetic layer (10).

In a second aspect, the present invention provides a magnetic device comprising a magnetic material of the first aspect and, optionally, electrical contacts.

Such electrical contacts may be required, for example for the writing and/or read-out process for some devices. Suitable electrical contacts include conducting substrates or bottom metallic strips and top metallic strips for tunneling devices (such as MRAM and TMR magnetic field sensors) or else contacts for in-plane resistance readout (such as GMR magnetic field sensors).

Such electrical contacts may be pre- or post-deposited during device fabrication, but the invention is not limited thereto.

In some embodiments, the substrate and/or the capping layer provide electrical contact.

In a third aspect, the present invention provides a method of preparing a magnetic material of the first aspect, the method comprising the steps of:
(a) depositing a first ferromagnetic layer comprising a first rare earth nitride material;
(b) depositing a blocking layer on the first ferromagnetic layer formed in step (a); and
(c) depositing a second ferromagnetic layer comprising a second rare earth nitride material on the blocking layer formed in step (b).

In some embodiments, the first ferromagnetic layer is deposited on a substrate. Suitable substrates are discussed above.

Accordingly, in some embodiments, the present invention provides a method of preparing a magnetic material of the first aspect, the method comprising the steps of:
(a) depositing a first ferromagnetic layer, comprising a first rare earth nitride material, on a substrate;
(b) depositing a blocking layer on the first ferromagnetic layer formed in step (a); and
(c) depositing a second ferromagnetic layer comprising a second rare earth nitride material on the blocking layer formed in step (b).

In some embodiments, the method further comprises:
(d) depositing a capping layer on the second ferromagnetic layer formed in step (c).

The layers are sequentially deposited, typically using ultra-high vacuum techniques known to those skilled in the art. Suitable techniques include, but are not limited to, physical vapour deposition (PVD), including pulsed laser deposition (PLD) and DC/RF magnetron sputtering, thermal evaporation, and molecular beam epitaxy (MBE). Other techniques, including but not limited to metalorganic chemical vapour deposition (MOCVD) may also be used.

In some embodiments, the layers are sequentially deposited by MBE. In some of these embodiments, reflection high energy electron diffraction (RHEED) is used for monitoring the growth of the layers.

The base pressure in the MBE apparatus is typically about $10^{-8}$ Torr or less.

GdN and SmN, for example, grow easily as thin films by MBE by combining the rare earth and a nitrogen source.

The nitrogen source provides reactive nitrogen atoms at the growth surface. In some embodiments, the nitrogen source is selected from the group consisting of pure molecular nitrogen, ammonia, and a source of active nitrogen, such as a nitrogen plasma or ionized nitrogen, or mixtures of any two or more thereof.

In some embodiments, the nitrogen source is selected from the group consisting of pure molecular nitrogen, ammonia, and a source of active nitrogen, such as a nitrogen plasma or ionized nitrogen.

In some embodiments, the nitrogen source is pure molecular nitrogen.

The rare earth can be provided from a source of the rare earth element, such as an effusion cell containing the solid rare earth, which is evaporated during the deposition.

The nitrogen source flux is typically a factor of at least 100 larger than the rare earth flux. If the ratio of the nitrogen source flux to the rare earth flux is less than about 100, the resulting films are likely to be heavily doped by nitrogen vacancies.

In some embodiments wherein a rare earth nitride material is deposited by MBE, the partial pressure or beam equivalent pressure (BEP) of the nitrogen source is about $10^{-5}$-$10^{-3}$ Torr.

In some embodiments, the BEP of the rare earth is about $10^{-8}$-$10^{-7}$ Torr.

The layers are typically deposited at a rate of about 0.01-1 nm/second. In some embodiments, the layers are deposited at a rate of about 0.01-0.5 nm/second. In some embodiments, the layers are deposited at a rate of about 0.01-0.15 nm/second. In some embodiments, the layers are deposited at a rate of about 0.01-0.1 nm/second.

In some embodiments, the layers are deposited at ambient or elevated temperatures.

A layer is generally deposited at elevated temperatures where it is desirable that the layer be epitaxial with the layer or substrate on which it is to be deposited.

For example, GdN and SmN films are strongly (111) textured when grown at ambient temperature, but they grow epitaxial on a suitable substrate at temperatures above 300° C.

Accordingly, in some embodiments, the layers are deposited at a temperature of about 500-900° C. In some embodiments, the layers are deposited at a temperature of about 500-800° C.

The layers may, however, be deposited at lower temperatures than those above, or even at ambient temperature, particularly if a polycrystalline material is desired. For example, depositing a layer of a rare earth nitride at lower temperatures typically results in fewer nitrogen vacancies.

The temperature during the deposition may be conveniently measured with an optical pyrometer, or other suitable apparatus as is known in the art, for example a thermocouple.

In some embodiments, two or more rare earth elements are simultaneously evaporated in the presence of pure $N_2$ gas, or an alternative nitrogen source as discussed above, to provide a layer comprising an alloy of rare earth nitride materials.

Similarly, in those embodiments wherein the substrate, blocking layer, and/or capping layer comprise(s) a group III nitride, alloys of group III nitrides are also contemplated.

Those persons skilled in the art will appreciate that one or more dopants may be introduced during deposition of one or more of the layers. Such dopants can alter the magnetic and/or electric properties of the resulting layers.

In a fourth aspect, the present invention provides a magnetic material when prepared by a method of the third aspect.

The present invention also provides a magnetic material obtainable by a method of the third aspect.

The following non-limiting examples are provided to illustrate the present invention and in no way limit the scope thereof.

EXAMPLES

Example 1

Referring to FIG. 1, a magnetic material (1) comprising a first ferromagnetic layer (5) of GdN and a second ferromagnetic layer (10) of SmN with a non-magnetic LaN blocking layer (15) was grown on a (111) oriented $Al_2O_3$ substrate (20) using molecular beam epitaxy.

A corresponding material comprising a first ferromagnetic layer (5) of GdN and a second ferromagnetic layer (10) of SmN but without a non-magnetic blocking layer (15) was also grown on a (111) oriented $Al_2O_3$ substrate (20) using molecular beam epitaxy.

The purity of each of the as-received Ga, La, Sm, and Gd solid charges was at least 3N.

The base pressure of the ultra-high vacuum chamber was $10^{-8}$ Torr. The substrate (20) was held at 750° C. during growth of the rare-earth nitride layers. The first ferromagnetic layer (5) of GdN was grown by evaporating Gd metal using an electron gun in presence of $3\times10^{-4}$ Torr partial pressure of pure (at least 4N) molecular nitrogen. The growth rate of the GdN was 0.05 nm/s, the beam equivalent pressure of Gd being $8\times10^{-8}$ Torr. GdN was grown to a thickness of 100 nm. When present, the non-magnetic blocking layer (15) of LaN was grown on top of the first ferromagnetic layer (5) of GdN by evaporating La metal using an electron gun under the same nitrogen pressure as used for the GdN layer. The growth rate of the LaN was 0.04 nm/s, the beam equivalent pressure of La being $7\times10^{-8}$ Torr. LaN was grown to a thickness of 6 nm. A second ferromagnetic layer (10) of SmN was grown, on top of the GdN for the first material and on top of the LaN for the second material, by evaporating Sm metal in a thermal evaporator under the same nitrogen partial pressure as used for the previous layers. The growth rate of the SmN was 0.02 nm/s, the beam equivalent pressure of Sm being $3\times10^{-8}$ Torr. SmN was grown to a thickness of 5.5 nm.

Both materials comprised a capping layer (25), specifically a 25 nm thick GaN layer grown at ambient temperature with a growth rate of 0.06 nm/s and a beam equivalent pressure of $1\times10^{-7}$ Torr. Ga metal was evaporated using an electron gun and ionized nitrogen from a commercial ionized nitrogen source at a partial pressure of $3\times10^{-4}$ Torr was used to form the nitride.

Figure 2:
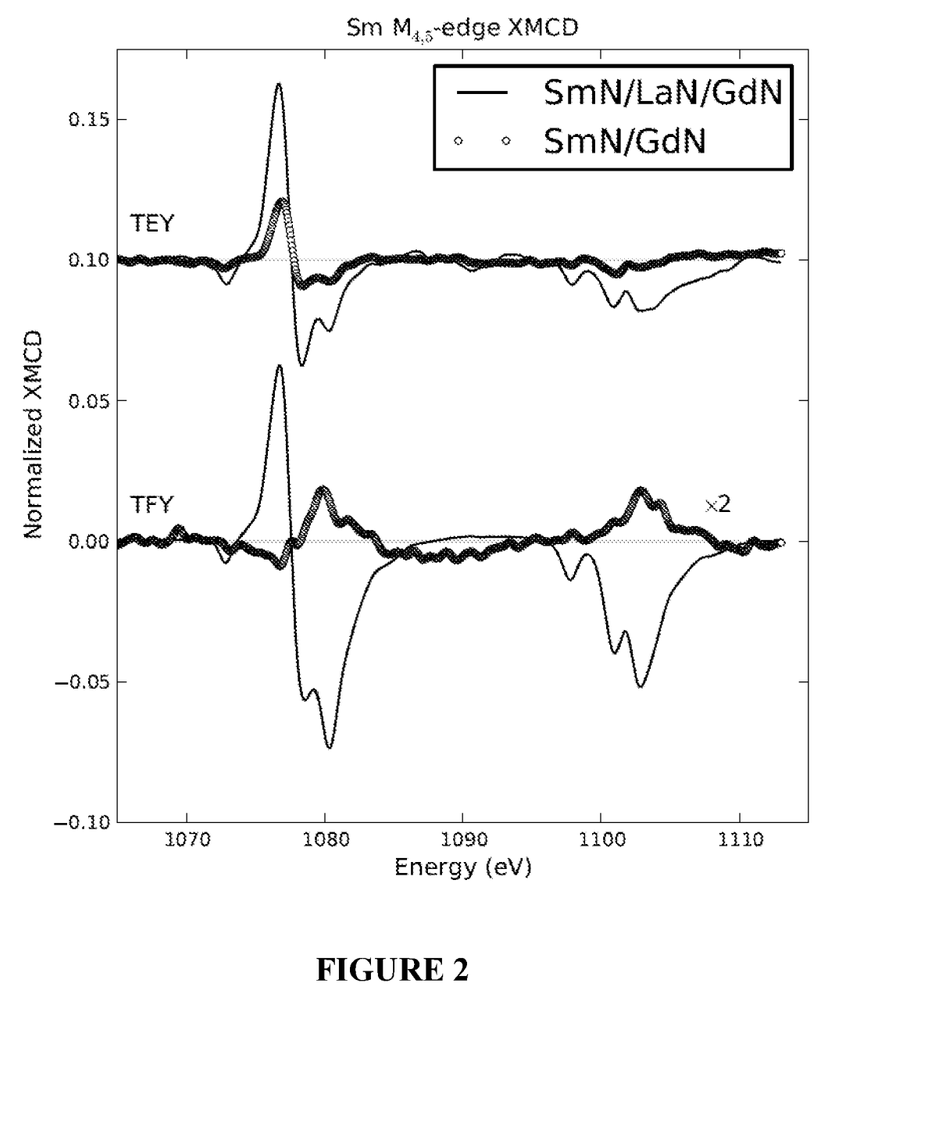
FIG. 2 shows x-ray magnetic circular dichroism (XMCD) spectra for a SmN/GdN material and a SmN/LaN/GdN material.

The x-ray magnetic circular dichroism (XMCD) spectra in FIG. 2 for the SmN/GdN material and the SmN/LaN/GdN material demonstrate the decoupling of the magnetisation direction in SmN and GdN layers by introducing a thin spacer layer between them. XMCD essentially measures the strength and direction of the magnetisation, and has the ability to probe the contributions from each layer individually (the plots in FIG. 2 show the contributions from the SmN). There are two types of spectra: TEY (total electron yield, upper part of plot) which probes only the surface, and TFY (total fluorescence yield, lower part of plot) which probes the whole thickness of the SmN layer all the way down to the interface with the underlying GdN layer. The TEY spectra are thus representative of the part of the SmN that is not affected by proximity to the GdN, while the TFY illustrates the effects on SmN of being close to GdN.

For the material with SmN directly adjacent to GdN the TFY has the same shape but opposite sign to the TEY. This means that the magnetisation at the surface of the SmN is pointed in the opposite direction to the magnetisation near the GdN interface, a clear sign that the GdN influences the adjacent SmN. For the material with a blocking layer between the SmN and GdN this inversion of the signal is not observed, implying that the magnetisation of the SmN points in a uniform direction throughout the layer, with no strong influence from the GdN. Thus, FIG. 2 demonstrates that the two magnetic layers are decoupled.

Example 2

Referring to FIG. 1, magnetic materials (1) configured as polycrystalline magnetic tunnel junctions consisting of GdN electrodes (first ferromagnetic layer (5), second ferromagnetic layer (10)) separated by a thin GaN tunnel barrier (blocking layer (15)) were grown at room temperature in a vacuum system with base pressure $1\times10^{-8}$ mbar ($7.5\times10^{-9}$ Torr). For the GdN layers (5,10), gadolinium metal was evaporated from an electron gun at a rate of 0.2-0.5 Å/s under a nitrogen partial pressure of $1\text{-}10\times10^{-5}$ mbar ($7.5\text{-}75\times10^{-6}$ Torr). GaN barriers (15) were grown in a similar fashion, with activated nitrogen supplied from a Kaufman ion source.

Tunnel junctions were formed by photolithography in a cross-contact geometry. A narrow (100 μm) gold contact strip (not shown) was deposited onto a sapphire substrate (20) via photolithography and a metal lift-off process. A 200 μm wide channel was fabricated by photolithography orthogonal to the gold strip. The GdN/GaN/GdN tunnel junctions (5,15,10) were then deposited, followed by a top layer of ~45 nm gadolinium metal that acts as a capping layer (25) to prevent oxidation of the GdN. After the growth of the tunnel junction and the Gd layer (25) the photoresist was removed via a second lift-off process. The metallic Gd layer (25) is ferromagnetic up to room temperature and was expected to break the symmetry between the magnetic properties of the top and bottom ferromagnetic GdN layers (5,10).

A cross-section scanning electron microscope (SEM) image showed the GdN layers (5,10) were each about 60 nm thick. X-ray reflectometry performed on a GaN layer grown under similar conditions yielded a thickness of several (~5) nm, consistent with the SEM results.

For comparison to the tunnel junctions a corresponding material comprising a ~100 nm GdN film (5) on a sapphire substrate (20), but without a blocking layer (15) or second ferromagnetic layer (10), was prepared under nominally identical growth conditions and capped with a ~30 nm thick GaN layer (25) instead of a Gd layer. X-ray diffraction (Θ-2Θ scan) revealed that the GdN (5) was polycrystalline, strongly (111) textured, and with an out of plane lattice parameter of 5.00±0.01 Å.

Figure 3:
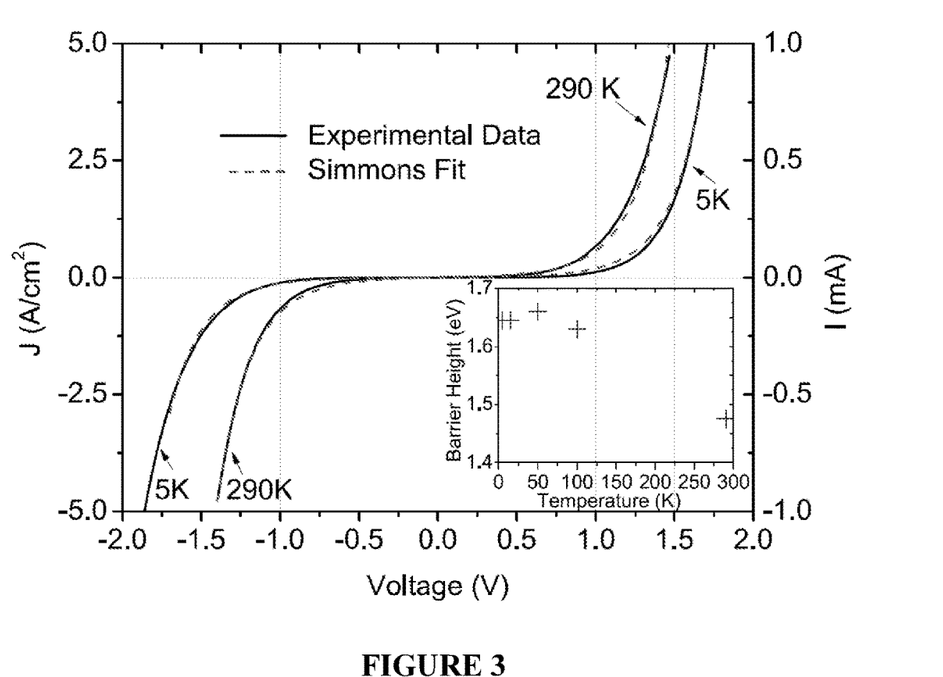
FIG. 3 shows current-voltage characteristics for a tunnel junction comprising a GdN/GaN/GdN material, fitted using the Simmons tunneling model (discussed below). The inset shows the modelled barrier height (average of forward and reverse current) plotted against temperature, extracted assuming a fixed barrier width of 1.91 nm.

FIG. 3 shows current density-voltage (J-V) characteristics at 5 and 290 K of a typical tunnel barrier. The curves are non-linear at all temperatures 5-290 K including those shown, as expected for a system dominated by tunneling. The data fit well to the model developed by Simmons for tunneling through a rectangular barrier (see J. G. Simmons, J. Appl. Phys. 34 1793 (1963) and J. G. Simmons, J. Appl. Phys. 35 2472 (1964)).

The data at all temperatures were fit extremely well with a barrier width of 1.91 nm, leaving the barrier height as the only temperature dependent fitting parameter. The inset to FIG. 3 shows the temperature dependent barrier height (average of forward and reverse current) extracted from the fitting.

The modelled barrier thickness was similar to SEM and x-ray reflectivity measurements, although slightly thinner than the best estimate of these, most likely due to the fact that tunneling is dominated by the thinnest parts of the barrier. The barrier height was found to be 1.5 eV at room temperature and 1.65 eV at low temperatures, suggesting that the Fermi level lies close to the middle of the gap of the GaN barrier (assuming $E_F$ in the GdN is close to the conduction band minimum).

Figure 4:
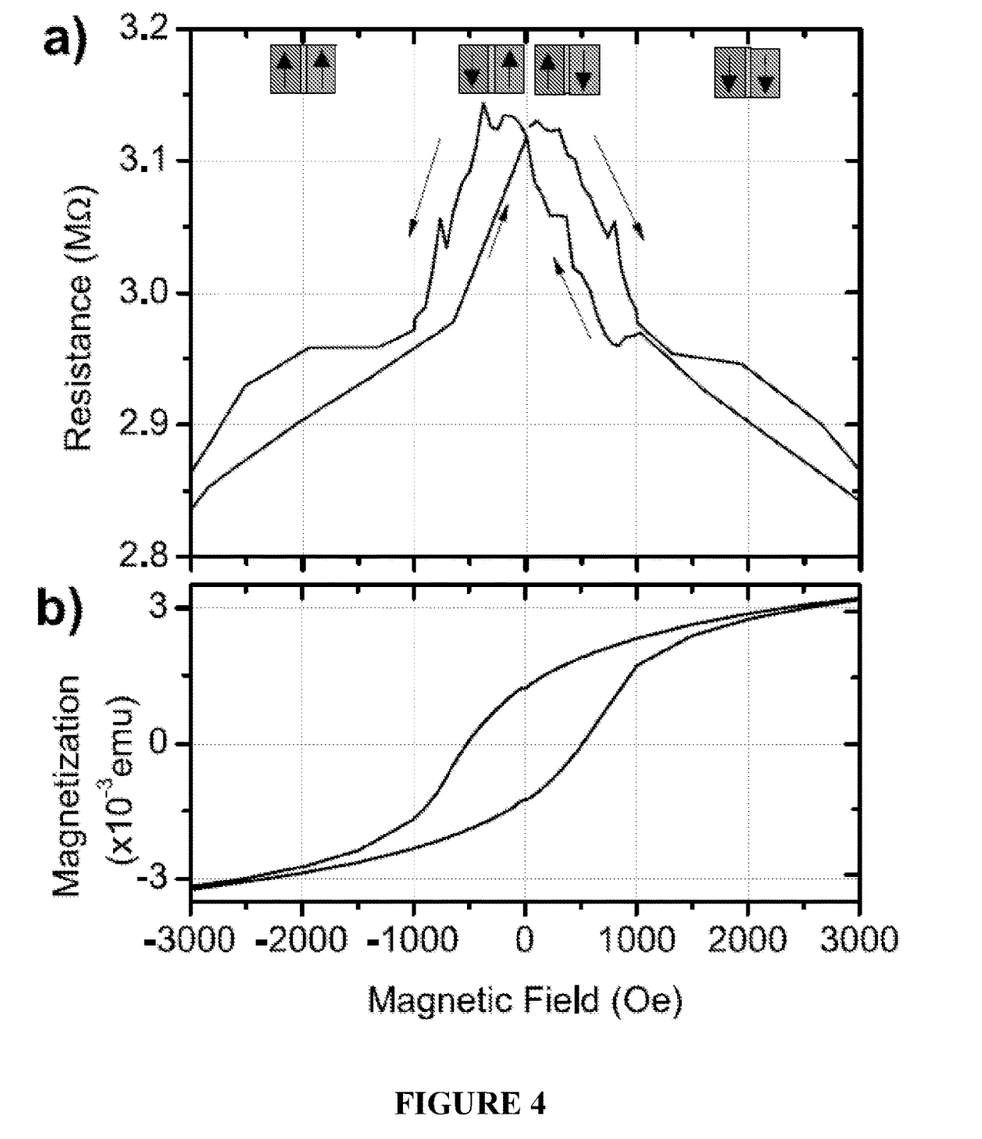
FIG. 4(a) shows the field dependence of the magnetoresistance for a tunnel junction comprising a GdN/GaN/GdN material obtained with a current of ~30 nA at 5 K. The diagrams above the data indicate the dominant magnetisation directions of the electrodes.
FIG. 4(b) shows the field dependent magnetisation of a tunnel junction comprising a GdN/GaN/GdN material.

The magnetoresistance at 5 K measured in both increasing and decreasing fields applied parallel to the layers showed hysteresis characteristic of that expected in magnetic tunnel junctions where one layer switches at lower fields than the other—see FIG. 4(a). The switching field matches the coercive field observed in the magnetic hysteresis shown in FIG. 4(b). The hysteresis in the magnetoresistance is attributed to differences in the dominant magnetisation directions in the GdN layers (5,10) at low fields resulting in a high resistance state.

Figure 5:
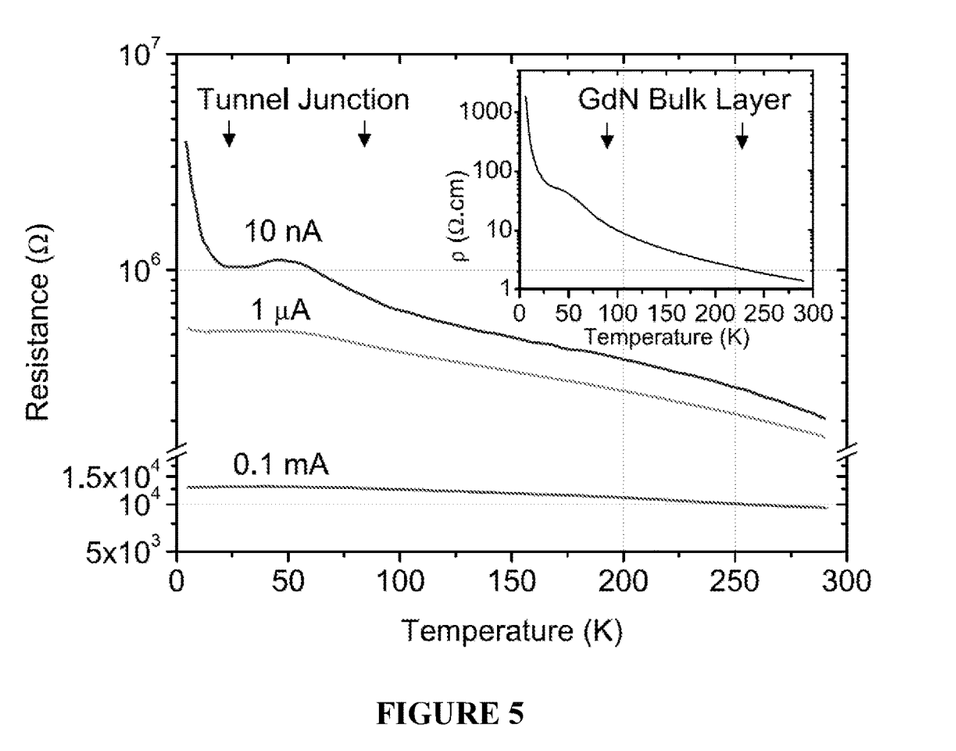
FIG. 5 shows the temperature dependent resistance of a tunnel junction comprising a GdN/GaN/GdN material measured using various applied currents. The inset shows the resistivity of a bulk GdN layer.

The temperature dependent resistance of the tunnel barrier measured at different applied currents is shown in FIG. 5. The resistance of the tunnel barrier measured at the smallest current (10 nA) is between four (at 5 K) and six (at 300 K) orders of magnitude larger than calculated from the GdN resistivity alone, so it is clear that the magnetic tunnel junction resistance is dominated by the GaN barrier. But the features in the resistivity of bulk GdN are reflected in the properties of the magnetic tunnel junction.

Indeed, the otherwise similar GdN control device with no GaN barrier had a very low resistance (<1Ω) in the vertical transport orientation. For comparison, the resistivity of the homogeneous GdN film measured in the van der Pauw geometry is shown in the inset to FIG. 5. The resistance of both the homogeneous film and the tunnel barrier show similar electronic structure, including a peak at 50 K near the Curie temperature of GdN that is caused by the onset of exchange splitting of the GdN bands, which reduces the majority carrier activation energy and hence the resistance. The peak near $T_C$ is suppressed and the overall resistance decreases in the tunnel junction at higher currents, whereas for bulk GdN these effects are not seen. For larger applied currents, and hence voltages, the relative effect of band splitting becomes diminished in comparison to the effect of the applied voltage on the barrier height. Clearly, transport through the tunnel junction is dominated by the presence of the GaN layer, but the density of states in the electrodes also has an important effect on the device characteristics.

Various aspects of the present invention are described by the following clauses:

1. A magnetic material comprising a first ferromagnetic layer, a second ferromagnetic layer, and a blocking layer between and in contact with each of the first and second ferromagnetic layers, wherein the first and second ferromagnetic layers have different coercive fields, and wherein the first ferromagnetic layer comprises a first rare earth nitride material and the second ferromagnetic layer comprises a second rare earth nitride material, and wherein the first and second rare earth nitride materials are each independently selected from the group consisting of praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), and ytterbium nitride (YbN), and alloys of any two or more thereof.
2. A magnetic material of clause 1, wherein the first and second rare earth nitride materials are each independently selected from the group consisting of PrN, NdN, SmN, GdN, TbN, DyN, HoN, ErN, and TmN, and alloys of any two or more thereof.
3. A magnetic material of clause 1, wherein the first and second rare earth nitride materials are each independently selected from the group consisting of NdN, SmN, EuN, GdN, DyN, HoN, ErN, and YbN, and alloys of any two or more thereof.
4. A magnetic material of clauses 1 to 3, wherein the first and second rare earth nitride materials are each independently selected from the group consisting of NdN, SmN, GdN, DyN, HoN, and ErN, and alloys of any two or more thereof.
5. A magnetic material of clause 1, wherein the first and second rare earth nitride materials are each independently selected from the group consisting of PrN, NdN, SmN, EuN, GdN, TbN, DyN, HoN, ErN, TmN, and YbN.
6. A magnetic material of clauses 1, 2 and 5, wherein the first and second rare earth nitride materials are each independently selected from the group consisting of PrN, NdN, SmN, GdN, TbN, DyN, HoN, ErN, and TmN.
7. A magnetic material of clauses 1, 3 and 5, wherein the first and second rare earth nitride materials are each independently selected from the group consisting of NdN, SmN, EuN, GdN, DyN, HoN, ErN, and YbN.
8. A magnetic material of clauses 1 to 7, wherein the first and second rare earth nitride materials are each independently selected from the group consisting of NdN, SmN, GdN, DyN, HoN, and ErN.
9. A magnetic material of clauses 1 to 4, wherein one or both of the first and second rare earth nitride materials is a rare earth nitride alloy.
10. A magnetic material of clause 9, wherein the rare earth nitride alloy is selected from the group consisting of (Sm,Gd)N, (Gd,Ho)N, and (Gd,Dy)N.
11. A magnetic material of clauses 1 to 10, wherein one or both of the first and second rare earth nitride materials further comprises one or more additional dopant(s).
12. A magnetic material of clauses 1 to 11, wherein the first and second rare earth nitride materials comprise less than about $10^{21}$ atoms/cm$^3$ of additional dopant(s) or other impurities.
13. A magnetic material of clauses 1 to 12, wherein the first ferromagnetic layer consists essentially of the first rare earth nitride material.
14. A magnetic material of clauses 1 to 13, wherein the second ferromagnetic layer consists essentially of the second rare earth nitride material.
15. A magnetic material of clauses 1 to 14, wherein the coercive field of the ferromagnetic layer with the lower coercive field is less than about 500 Oe.
16. A magnetic material of clauses 1 to 15, wherein the coercive field of the ferromagnetic layer with the higher coercive field is larger than the coercive field of the layer with the lower coercive field by a factor of at least about 2.
17. A magnetic material of clauses 1 to 16, wherein the coercive fields are measured at about 70 K.
18. A magnetic material of clauses 1 to 16, wherein the coercive fields are measured at about 50 K.
19. A magnetic material of clauses 1 to 16, wherein the coercive fields are measured at about 4 K.
20. A magnetic material of clauses 1 to 19, wherein the coercive field difference between the first and second ferromagnetic layers is temperature sensitive.
21. A magnetic material of clauses 1 to 20, wherein the coercive field of the second ferromagnetic layer is higher than that of the first ferromagnetic layer.
22. A magnetic material of clauses 1 to 20, wherein the coercive field of the first ferromagnetic layer is higher than that of the second ferromagnetic layer.
23. A magnetic material of clauses 1 to 21, wherein the first ferromagnetic rare earth nitride material comprises GdN.
24. A magnetic material of clauses 1 to 23, wherein the first and second ferromagnetic rare earth nitride materials comprise GdN.
25. A magnetic material of clauses 1 to 21 and 23, wherein the second ferromagnetic rare earth nitride material comprises SmN.
26. A magnetic material of clauses 1 to 21, 23 and 25, wherein the first ferromagnetic rare earth nitride material comprises GdN and the second ferromagnetic rare earth nitride material comprises SmN.
27. A magnetic material of clauses 1 to 20 and 22, wherein the first ferromagnetic rare earth nitride material comprises SmN and the second ferromagnetic rare earth nitride material comprises GdN.
28. A magnetic material of clauses 1 to 27, wherein the blocking layer is epitaxial with the first ferromagnetic layer.
29. A magnetic material of clauses 1 to 28, wherein the second ferromagnetic layer is epitaxial with the blocking layer.
30. A magnetic material of clauses 1 to 29, wherein the blocking layer is epitaxial with the first ferromagnetic layer and the second ferromagnetic layer is epitaxial with the blocking layer.
31. A magnetic material of clauses 1 to 30, wherein the blocking layer comprises a third rare earth nitride material.
32. A magnetic material of clauses 1 to 31, wherein the blocking layer comprises LaN or LuN.
33. A magnetic material of clauses 1 to 33, wherein the blocking layer consists essentially of LaN.
34. A magnetic material of clauses 1 to 33, wherein the blocking layer consists essentially of LuN.
35. A magnetic material of clauses 1 to 27, wherein the blocking layer is selected from the group consisting of LaN, LuN, HfN, AlN, GaN, and (Al,In,Ga)N alloys.
36. A magnetic material of clauses 1 to 27 and 35, wherein the blocking layer comprises GaN.
37. A magnetic material of clauses 1 to 36, wherein the first and second ferromagnetic layers are each independently about 5-200 nm thick.

38. A magnetic material of clauses 1 to 37, wherein the blocking layer is about 1-200 nm thick.
39. A magnetic material of clauses 1 to 38, wherein the magnetic material further comprises a substrate in contact with the first ferromagnetic layer.
40. A magnetic material of clause 39, wherein the first ferromagnetic layer is epitaxial with the substrate.
41. A magnetic material of clause 39 or 40, wherein the first ferromagnetic layer is epitaxial with the substrate and the blocking layer is epitaxial with the first ferromagnetic layer.
42. A magnetic material of clauses 39 to 41, wherein the first ferromagnetic layer is epitaxial with the substrate, the blocking layer is epitaxial with the first ferromagnetic layer, and the second ferromagnetic layer is epitaxial with the blocking layer.
43. A magnetic material of clauses 39 to 42, wherein the substrate comprises a buffer layer in contact with the first ferromagnetic layer.
44. A magnetic material of clauses 1 to 43, wherein the magnetic material further comprises a capping layer in contact with the second ferromagnetic layer.
45. A magnetic material of clause 44, wherein the capping layer is epitaxial with the second ferromagnetic layer.
46. A method of preparing a magnetic material, the magnetic material comprising a first ferromagnetic layer, a second ferromagnetic layer, and a blocking layer between and in contact with each of the first and second ferromagnetic layers, wherein the first and second ferromagnetic layers have different coercive fields, and wherein the first ferromagnetic layer comprises a first rare earth nitride material and the second ferromagnetic layer comprises a second rare earth nitride material, and wherein the first and second rare earth nitride materials are each independently selected from the group consisting of praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), and ytterbium nitride (YbN), and alloys of any two or more thereof, the method comprising the steps of:
 (a) depositing the first ferromagnetic layer comprising the first rare earth nitride material;
 (b) depositing the blocking layer on the first ferromagnetic layer formed in step (a); and
 (c) depositing the second ferromagnetic layer comprising the second rare earth nitride material on the blocking layer formed in step (b).
47. A method of clause 46, wherein the first and second rare earth nitride materials are each independently selected from the group consisting of PrN, NdN, SmN, GdN, TbN, DyN, HoN, ErN, and TmN, and alloys of any two or more thereof.
48. A method of clause 46, wherein the first and second rare earth nitride materials are each independently selected from the group consisting of NdN, SmN, EuN, GdN, DyN, HoN, ErN, and YbN, and alloys of any two or more thereof.
49. A method of clauses 46 to 48, wherein the first and second rare earth nitride materials are each independently selected from the group consisting of NdN, SmN, GdN, DyN, HoN, and ErN, and alloys of any two or more thereof.
50. A method of clause 46, wherein the first and second rare earth nitride materials are each independently selected from the group consisting of PrN, NdN, SmN, EuN, GdN, TbN, DyN, HoN, ErN, TmN, and YbN.
51. A method of clauses 46, 47 and 50, wherein the first and second rare earth nitride materials are each independently selected from the group consisting of PrN, NdN, SmN, GdN, TbN, DyN, HoN, ErN, and TmN.
52. A method of clauses 46, 48 and 50, wherein the first and second rare earth nitride materials are each independently selected from the group consisting of NdN, SmN, EuN, GdN, DyN, HoN, ErN, and YbN.
53. A method of clauses 46 to 52, wherein the first and second rare earth nitride materials are each independently selected from the group consisting of NdN, SmN, GdN, DyN, HoN, and ErN.
54. A method of clauses 46 to 49, wherein one or both of the first and second rare earth nitride materials is a rare earth nitride alloy.
55. A method of clause 54, wherein the rare earth nitride alloy is selected from the group consisting of (Sm,Gd)N, (Gd,Ho)N, and (Gd,Dy)N.
56. A method of clauses 46 to 55, wherein one or both of the first and second rare earth nitride materials further comprises one or more additional dopant(s).
57. A method of clauses 46 to 56, wherein the first and second rare earth nitride materials comprise less than about $10^{21}$ atoms/cm$^3$ of additional dopant(s) or other impurities.
58. A method of clauses 46 to 57, wherein the first ferromagnetic layer consists essentially of the first rare earth nitride material.
59. A method of clauses 46 to 58, wherein the second ferromagnetic layer consists essentially of the second rare earth nitride material.
60. A method of clauses 46 to 59, wherein the coercive field of the ferromagnetic layer with the lower coercive field is less than about 500 Oe.
61. A method of clauses 46 to 60, wherein the coercive field of the ferromagnetic layer with the higher coercive field is larger than the coercive field of the layer with the lower coercive field by a factor of at least about 2.
62. A method of clauses 46 to 61, wherein the coercive fields are measured at about 70 K.
63. A method of clauses 46 to 61, wherein the coercive fields are measured at about 50 K.
64. A method of clauses 46 to 61, wherein the coercive fields are measured at about 4 K.
65. A method of clauses 46 to 64, wherein the coercive field difference between the first and second ferromagnetic layers is temperature sensitive.
66. A method of clauses 46 to 65, wherein the coercive field of the second ferromagnetic layer is higher than that of the first ferromagnetic layer.
67. A method of clauses 46 to 65, wherein the coercive field of the first ferromagnetic layer is higher than that of the second ferromagnetic layer.
68. A method of clauses 46 to 66, wherein the first ferromagnetic rare earth nitride material comprises GdN.
69. A method of clauses 46 to 68, wherein the first and second ferromagnetic rare earth nitride materials comprise GdN.
70. A method of clauses 46 to 66 and 68, wherein the second ferromagnetic rare earth nitride material comprises SmN.
71. A method of clauses 46 to 66, 68 and 70, wherein the first ferromagnetic rare earth nitride material comprises GdN and the second ferromagnetic rare earth nitride material comprises SmN.

72. A method of clauses 46 to 65 and 67, wherein the first ferromagnetic rare earth nitride material comprises SmN and the second ferromagnetic rare earth nitride material comprises GdN.
73. A method of clauses 46 to 72, wherein the blocking layer is epitaxial with the first ferromagnetic layer.
74. A method of clauses 46 to 73, wherein the second ferromagnetic layer is epitaxial with the blocking layer.
75. A method of clauses 46 to 74, wherein the blocking layer is epitaxial with the first ferromagnetic layer and the second ferromagnetic layer is epitaxial with the blocking layer.
76. A method of clauses 46 to 75, wherein the blocking layer comprises a third rare earth nitride material.
77. A method of clauses 46 to 76, wherein the blocking layer comprises LaN or LuN.
78. A method of clauses 46 to 77, wherein the blocking layer consists essentially of LaN.
79. A method of clauses 46 to 78, wherein the blocking layer consists essentially of LuN.
80. A method of clauses 46 to 72, wherein the blocking layer is selected from the group consisting of LaN, LuN, HfN, AlN, GaN, and (Al,In,Ga)N alloys.
81. A method of clauses 46 to 72 and 80, wherein the blocking layer comprises GaN.
82. A method of clauses 46 to 81, wherein the first and second ferromagnetic layers are each independently about 5-200 nm thick.
83. A method of clauses 46 to 82, wherein the blocking layer is about 1-200 nm thick.
84. A method of preparing a magnetic material of clauses 1 to 38, the method comprising the steps of:
  (a) depositing a first ferromagnetic layer comprising a first rare earth nitride material;
  (b) depositing a blocking layer on the first ferromagnetic layer formed in step (a); and
  (c) depositing a second ferromagnetic layer comprising a second rare earth nitride material on the blocking layer formed in step (b).
85. A method of clauses 46 to 84, wherein the first ferromagnetic layer is deposited on a substrate.
86. A method of clause 85, wherein the first ferromagnetic layer is epitaxial with the substrate.
87. A method of clause 85 or 86, wherein the first ferromagnetic layer is epitaxial with the substrate and the blocking layer is epitaxial with the first ferromagnetic layer.
88. A method of clauses 85 to 87, wherein the first ferromagnetic layer is epitaxial with the substrate, the blocking layer is epitaxial with the first ferromagnetic layer, and the second ferromagnetic layer is epitaxial with the blocking layer.
89. A method of clauses 85 to 88, wherein the substrate comprises a buffer layer in contact with the first ferromagnetic layer.
90. A method of clauses 46 to 89, wherein the method further comprises:
  (d) depositing a capping layer on the second ferromagnetic layer formed in step (c).
91. A method of clause 90, wherein the capping layer is epitaxial with the second ferromagnetic layer.
92. A method of clauses 46 to 91, wherein the layers are sequentially deposited using an ultra-high vacuum technique.
93. A method of clause 92, wherein the ultra-high vacuum technique is selected from the group consisting of physical vapour deposition (PVD), pulsed laser deposition (PLD), DC/RF magnetron sputtering, thermal evaporation, and molecular beam epitaxy (MBE).
94. A method of clauses 46 to 93, wherein the layers are sequentially deposited by MBE.
95. A method of clauses 46 to 91, wherein one or more of the rare earth nitride materials is deposited by MBE by combining the rare earth and a nitrogen source.
96. A method of clause 95, wherein the nitrogen source is selected from the group consisting of pure molecular nitrogen, ammonia, and a source of active nitrogen, or mixtures of any two or more thereof.
97. A method of clause 96, wherein the source of active nitrogen is a nitrogen plasma or ionized nitrogen.
98. A method of clause 97, wherein the nitrogen source is pure molecular nitrogen.
99. A method of clauses 95 to 98, wherein the nitrogen source flux is a factor of at least 100 larger than the rare earth flux.
100. A method of clauses 95 to 99, wherein the partial pressure or beam equivalent pressure (BEP) of the nitrogen source is about $10^{-5}$-$10^{-3}$ Torr.
101. A method of clauses 95 to 100, wherein the BEP of the rare earth is about $10^{-8}$-$10^{-7}$ Torr.
102. A method of clauses 46 to 101, wherein the layers are deposited at a rate of about 0.01-1 nm/second.
103. A method of clauses 46 to 102, wherein the layers are deposited at ambient or elevated temperatures.
104. A method of clauses 46 to 103, wherein one or more of the layers is deposited at a temperature of about 500-900° C.
105. A method of clauses 46 to 104, wherein one or more of the layers is deposited at a temperature of about 500-800° C.
106. A magnetic material when prepared by a method of clauses 46 to 105.
107. A magnetic material obtainable by a method of clauses 46 to 105.
108. A magnetic device comprising a magnetic material of clauses 1 to 45, 106 and 107 and, optionally, electrical contacts.
109. A magnetic device of clause 108, wherein the substrate and/or the capping layer provide electrical contact.

It is not the intention to limit the scope of the invention to the abovementioned examples only. As would be appreciated by a skilled person in the art, many variations are possible without departing from the scope of the invention as set out in the accompanying claims.

What is claimed is:
1. A magnetic material comprising a first ferromagnetic layer, a second ferromagnetic layer, and a blocking layer between and in contact with each of the first and second ferromagnetic layers, wherein the first and second ferromagnetic layers have different coercive fields, and wherein the first ferromagnetic layer comprises a first rare earth nitride material and the second ferromagnetic layer comprises a second rare earth nitride material, and wherein the first and second rare earth nitride materials are each independently selected from the group consisting of praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), and ytterbium nitride (YbN), and alloys of any two or more thereof,
  wherein the blocking layer is a material selected from the group consisting of LaN, LuN, HfN, AlN, GaN, and (Al,In,Ga)N alloys.

2. A magnetic material as claimed in claim 1, wherein one or both of the first and second rare earth nitride materials further comprises one or more additional dopant(s).

3. A magnetic material as claimed in claim 1, wherein the first ferromagnetic rare earth nitride material comprises GdN and the second ferromagnetic rare earth nitride material comprises SmN, or wherein the first ferromagnetic rare earth nitride material comprises SmN and the second ferromagnetic rare earth nitride material comprises GdN.

4. A magnetic material as claimed in claim 1, wherein the blocking layer is about 1-200 nm thick.

5. A magnetic material as claimed in claim 1, wherein the magnetic material further comprises a substrate in contact with the first ferromagnetic layer, and wherein the first ferromagnetic layer is epitaxial with the substrate, the blocking layer is epitaxial with the first ferromagnetic layer, and the second ferromagnetic layer is epitaxial with the blocking layer.

6. A magnetic material as claimed in claim 1, wherein the magnetic material further comprises a capping layer in contact with the second ferromagnetic layer.

7. A method of preparing a magnetic material, the magnetic material comprising a first ferromagnetic layer, a second ferromagnetic layer, and a blocking layer between and in contact with each of the first and second ferromagnetic layers, wherein the first and second ferromagnetic layers have different coercive fields, and wherein the first ferromagnetic layer comprises a first rare earth nitride material and the second ferromagnetic layer comprises a second rare earth nitride material, and wherein the first and second rare earth nitride materials are each independently selected from the group consisting of praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), and ytterbium nitride (YbN), and alloys of any two or more thereof, the method comprising the steps of:
(a) depositing the first ferromagnetic layer comprising the first rare earth nitride material;
(b) depositing the blocking layer on the first ferromagnetic layer formed in step (a); and
(c) depositing the second ferromagnetic layer comprising the second rare earth nitride material on the blocking layer formed in step (b),
wherein the blocking layer is a material selected from the group consisting of LaN, LuN, HfN, AlN, GaN, and (Al,In,Ga)N alloys.

8. A method as claimed in claim 7, wherein one or both of the first and second rare earth nitride materials further comprises one or more additional dopant(s).

9. A method as claimed in claim 7, wherein the first ferromagnetic rare earth nitride material comprises GdN and the second ferromagnetic rare earth nitride material comprises SmN, or wherein the first ferromagnetic rare earth nitride material comprises SmN and the second ferromagnetic rare earth nitride material comprises GdN.

10. A method as claimed in claim 7, wherein the blocking layer is about 1-200 nm thick.

11. A method as claimed in claim 7, wherein the first ferromagnetic layer is deposited on a substrate, and wherein the first ferromagnetic layer is epitaxial with the substrate, the blocking layer is epitaxial with the first ferromagnetic layer, and the second ferromagnetic layer is epitaxial with the blocking layer.

12. A method as claimed in claim 7, wherein the method further comprises:
(d) depositing a capping layer on the second ferromagnetic layer formed in step (c).

13. A method as claimed in claim 7, wherein one or more of the rare earth nitride materials is deposited by MBE by combining the rare earth and a nitrogen source, and wherein the nitrogen source is selected from the group consisting of pure molecular nitrogen, ammonia, and a source of active nitrogen, or mixtures of any two or more thereof.

14. A method as claimed in claim 13, wherein the nitrogen source flux is a factor of at least 100 larger than the rare earth flux.

15. A method as claimed in claim 7, wherein the layers are deposited at ambient or elevated temperatures.

16. A magnetic material when prepared by a method as claimed in claim 7.

17. A magnetic device comprising a magnetic material of claim 1 and, optionally, electrical contacts.

18. A magnetic device as claimed in claim 17, wherein a substrate and/or a capping layer provide electrical contact.

19. A magnetic material as claimed in claim 1, wherein the coercive field of the ferromagnetic layer having a lower coercive field is less than about 500 Oe.

20. A magnetic material as claimed in claim 1, wherein the coercive field of the ferromagnetic layer having a higher coercive field is larger than the coercive field of the layer with the lower coercive field by a factor of at least about 2.

* * * * *